United States Patent
Wang et al.

(10) Patent No.: US 12,354,912 B2
(45) Date of Patent: Jul. 8, 2025

(54) PLASMA-DOPED TRENCHES FOR MEMORY

(71) Applicant: Micron Technology, Inc., Boise, ID (US)

(72) Inventors: Yiping Wang, Boise, ID (US); Wesley O. Mckinsey, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 346 days.

(21) Appl. No.: 17/950,640

(22) Filed: Sep. 22, 2022

(65) Prior Publication Data

US 2024/0105510 A1    Mar. 28, 2024

(51) Int. Cl.
*H01L 21/768* (2006.01)
*H01L 21/3215* (2006.01)
*H01L 23/532* (2006.01)
*H01L 23/535* (2006.01)

(52) U.S. Cl.
CPC .. *H01L 21/76886* (2013.01); *H01L 21/32155* (2013.01); *H01L 21/76804* (2013.01); *H01L 21/76805* (2013.01); *H01L 21/7684* (2013.01); *H01L 21/76895* (2013.01); *H01L 23/53271* (2013.01); *H01L 23/535* (2013.01)

(58) Field of Classification Search
CPC ......... H01L 21/32155; H01L 21/76804; H01L 23/53271; H10B 41/27; H10B 43/27
See application file for complete search history.

(56) References Cited

U.S. PATENT DOCUMENTS

2021/0226041 A1*  7/2021  Yilmaz ................ H10D 12/461

\* cited by examiner

*Primary Examiner* — Thanhha S Pham
(74) *Attorney, Agent, or Firm* — Holland & Hart LLP

(57) ABSTRACT

Methods, systems, and devices for plasma-doped trenches for memory are described. A method for forming a memory device with plasma-doped trenches may include forming a stack of materials having alternating layers of polysilicon and oxide materials. A trench may be etched in the stack and doped using a plasma doping process. In some examples, the trench may be doped by applying Boron fluoride, diborane, methane, or Boron and Carbon Hydride gases diluted with Hydrogen ($H_2$) or Helium to the sidewalls and bottom surface of the trench, which may dope portions of the polysilicon material with Boron, Carbon, Fluorine, Helium, or Hydrogen.

11 Claims, 6 Drawing Sheets

PLASMA-DOPED TRENCHES FOR MEMORY

FIELD OF TECHNOLOGY

The following relates to one or more systems for memory, including plasma-doped trenches for memory.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not- or (NOR) and not- and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

In some cases, a memory device (e.g., a NAND device) may include a memory array having a vertical architecture. Portions of the memory array may be formed from a stack of materials having alternating layers of material. In some examples, material may be removed from the stack (e.g., etched from the stack) to form a trench, and portions of the trench (e.g., sidewalls of the trench) may be doped. However, conventional methods for doping a trench in a stack of materials may utilize numerous processing steps. For example, conventional methods may include forming (e.g., depositing) a first portion of the stack, doping the first portion of the stack, forming (e.g., depositing) an additional portion of the stack, doping the additional portion of the stack, and forming the trench. Additionally or alternatively, patterning processes may occur between any of the aforementioned steps. Such methods may decrease overall manufacturing efficiency and increase processing time and fabrication costs. Accordingly, an improved processing flow for doping trenches may be desirable.

An improved processing flow for doping trenches is described herein. In some examples, a stack of alternating materials may be formed (e.g., deposited). The stack of materials may include, for example, alternating layers of a polysilicon material and an oxide material. A trench may be formed (e.g., etched) in the stack of materials and doped using a plasma doping process. The plasma doping process may include applying Boron fluoride, diborane, methane, or Boron and Carbon Hydride gases diluted with Hydrogen ($H_2$) or Helium to the sidewalls and bottom surface of the trench, which may dope portions of the polysilicon material with Boron, Carbon, Fluorine, Helium, or Hydrogen. Additionally or alternatively, a single photoresist layer may be deposited above the stack prior to doping the trench (or prior to filling the trench with a dielectric material). Accordingly, as described herein, trenches within a stack of materials may be doped using relatively few processing steps, which may increase overall manufacturing efficiency and decrease processing time and fabrication costs.

Figure 1:
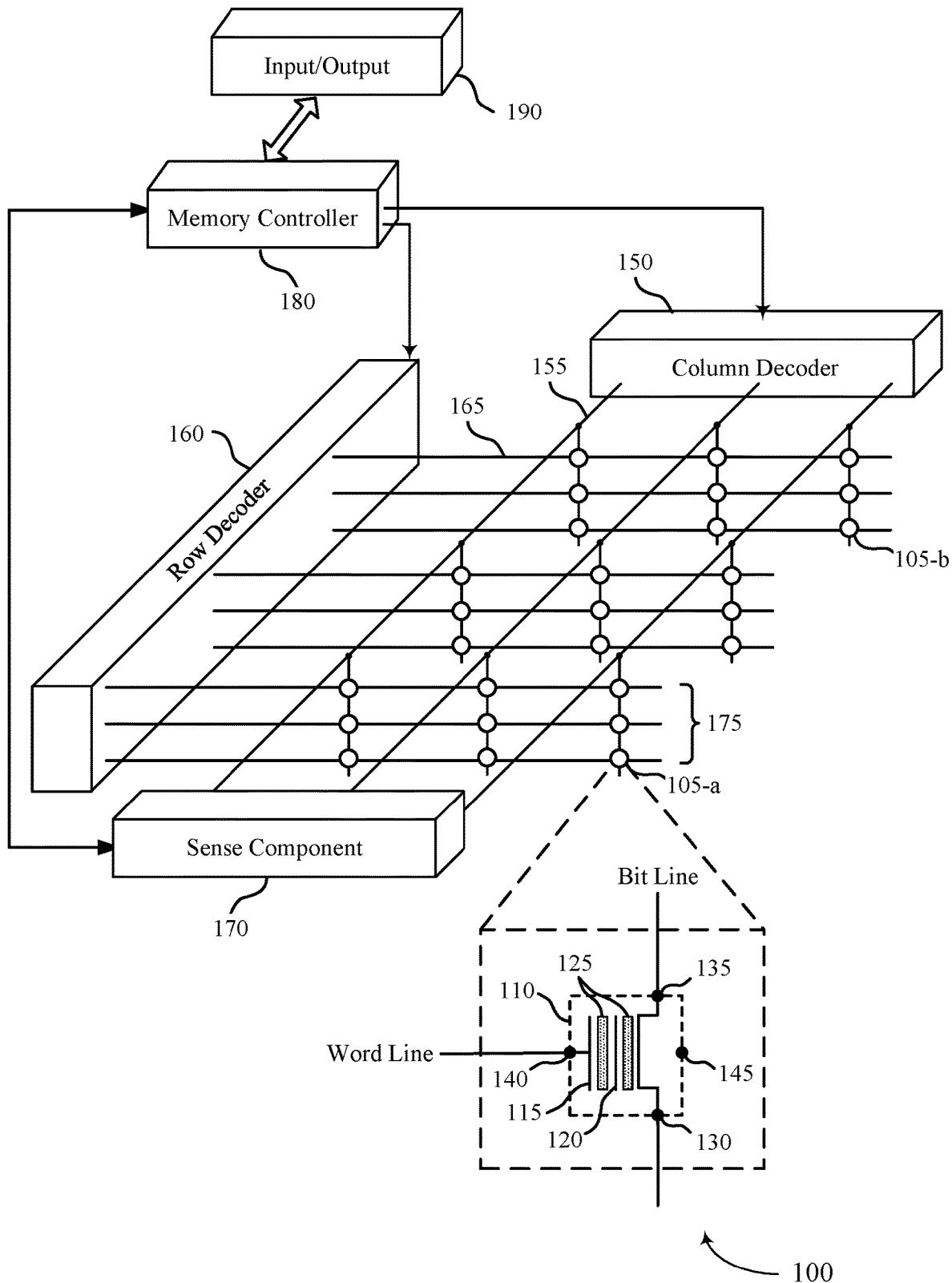
FIG. 1 illustrates an example of a system that supports plasma-doped trenches for memory in accordance with examples as disclosed herein.
Figure 2:
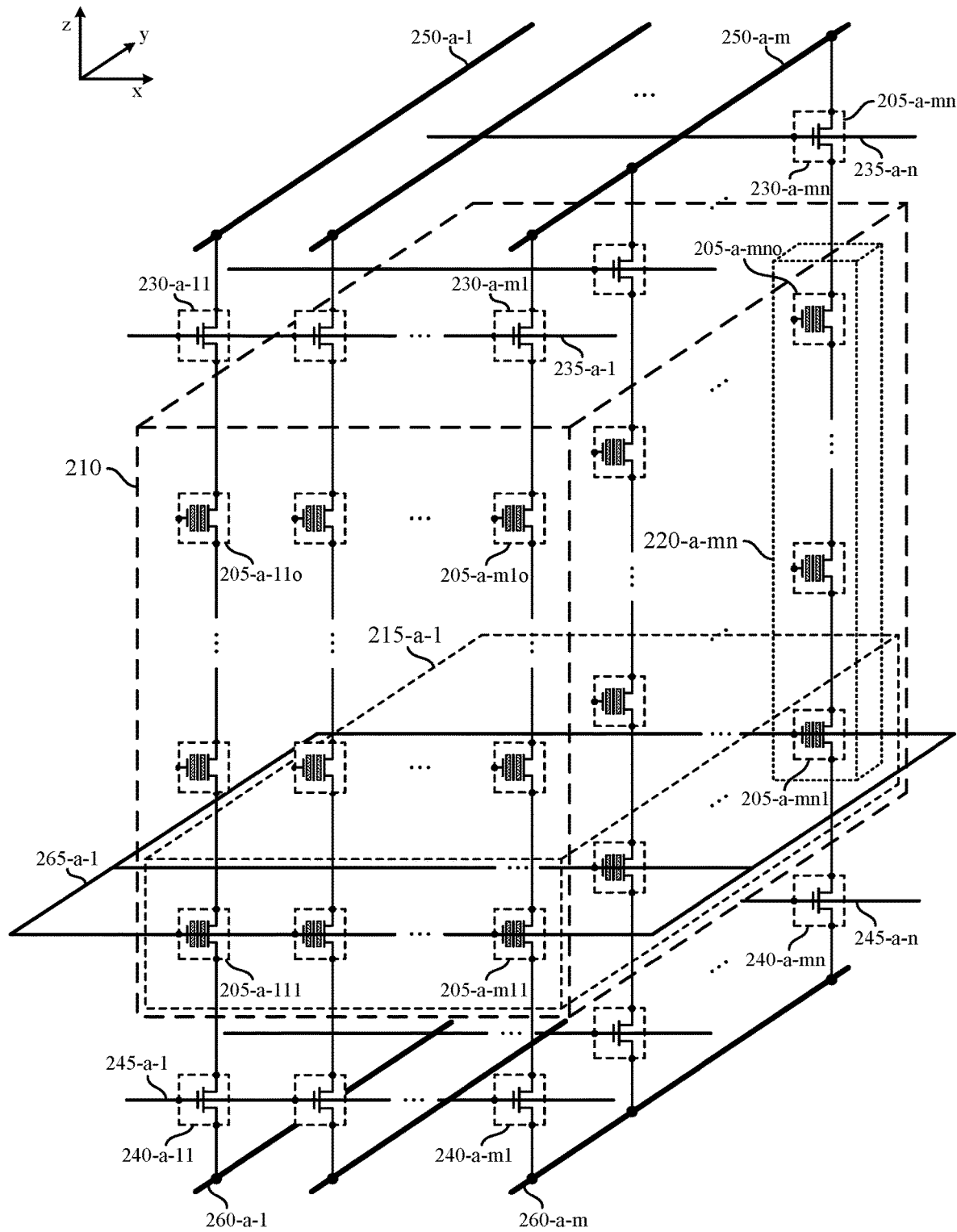
FIG. 2 illustrates an example of a memory architecture that supports plasma-doped trenches for memory in accordance with examples as disclosed herein.

Features of the disclosure are initially described in the context of systems, devices, and circuits with reference to FIGS. 1 and 2. Features of the disclosure are described in the context of processing steps with reference to FIGS. 3A through 3F. These and other features of the disclosure are further illustrated by and described in the context of a flowchart that relates to plasma-doped trenches for memory with reference to FIG. 4.

FIG. 1 illustrates an example of a memory device 100 that supports plasma-doped trenches for memory in accordance with examples as disclosed herein. FIG. 1 is an illustrative representation of various components and features of the memory device 100. As such, the components and features of the memory device 100 are shown to illustrate functional interrelationships, and not necessarily physical positions within the memory device 100. Further, although some elements included in FIG. 1 are labeled with a numeric indicator, some other corresponding elements are not labeled, even though they are the same or would be understood to be similar, in an effort to increase visibility and clarity of the depicted features.

The memory device 100 may include one or more memory cells 105, such as memory cell 105-*a* and memory cell 105-*b*. In some examples, a memory cell 105 may be a NAND memory cell, such as in the blow-up diagram of memory cell 105-*a*. Each memory cell 105 may be programmed to store a logic value representing one or more bits of information. In some examples, a single memory cell 105—such as a memory cell 105 configured as a single-level cell (SLC)—may be programmed to one of two supported states and thus may store one bit of information at a time (e.g., a logic 0 or a logic 1). In some other examples, a single memory cell 105—such as a memory cell 105 configured as a multi-level cell (MLC), a tri-level cell (TLC), a quad-level cell (QLC), or other type of multiple-level memory cell 105—may be programmed to one state of more than two supported states and thus may store more than one bit of information at a time. In some cases, a multiple-level memory cell 105 (e.g., an MLC memory cell, a TLC memory cell, a QLC memory cell) may be physically different than an SLC cell. For example, a multiple-level memory cell 105 may use a different cell geometry or may be fabricated using different materials. In some examples, a multiple-level memory cell 105 may be physically the same or similar to an SLC cell, and other circuitry in a memory block (e.g., a controller, sense amplifiers, drivers) may be configured to operate (e.g., read and program) the memory cell as an SLC cell, or as an MLC cell, or as a TLC cell, etc.

In some NAND memory arrays, each memory cell 105 may be illustrated as a transistor that includes a charge trapping structure (e.g., a floating gate, a replacement gate, a dielectric material) for storing an amount of charge representative of a logic value. For example, the blow-up in FIG. 1 illustrates a NAND memory cell 105-a that includes a transistor 110 (e.g., a metal-oxide-semiconductor (MOS) transistor) that may be used to store a logic value. The transistor 110 may include a control gate 115 and a charge trapping structure 120 (e.g., a floating gate, a replacement gate), where the charge trapping structure 120 may, in some examples, be between two portions of dielectric material 125. The transistor 110 also may include a first node 130 (e.g., a source or drain) and a second node 135 (e.g., a drain or source). A logic value may be stored in transistor 110 by storing (e.g., writing) a quantity of electrons (e.g., an amount of charge) on the charge trapping structure 120. An amount of charge to be stored on the charge trapping structure 120 may depend on the logic value to be stored. The charge stored on the charge trapping structure 120 may affect the threshold voltage of the transistor 110, thereby affecting the amount of current that flows through the transistor 110 when the transistor 110 is activated (e.g., when a voltage is applied to the control gate 115, when the memory cell 105-a is read). In some examples, the charge trapping structure 120 may be an example of a floating gate or a replacement gate that may be part of a 2D NAND structure. For example, a 2D NAND array may include multiple control gates 115 and charge trapping structures 120 arranged around a single channel (e.g., a horizontal channel, a vertical channel, a columnar channel, a pillar channel).

A logic value stored in the transistor 110 may be sensed (e.g., as part of a read operation) by applying a voltage to the control gate 115 (e.g., to control node 140, via a word line 165) to activate the transistor 110 and measuring (e.g., detecting, sensing) an amount of current that flows through the first node 130 or the second node 135 (e.g., via a bit line 155). For example, a sense component 170 may determine whether an SLC memory cell 105 stores a logic 0 or a logic 1 in a binary manner (e.g., based on a presence or absence of a current through the memory cell 105 when a read voltage is applied to the control gate 115, based on whether the current is above or below a threshold current). For a multiple-level memory cell 105, a sense component 170 may determine a logic value stored in the memory cell 105 based on various intermediate threshold levels of current when a read voltage is applied to the control gate 115, or by applying different read voltages to the control gate and evaluating different resulting levels of current through the transistor 110, or various combinations thereof. In one example of a multiple-level architecture, a sense component 170 may determine the logic value of a TLC memory cell 105 based on eight different levels of current, or ranges of current, that define the eight potential logic values that could be stored by the TLC memory cell 105.

An SLC memory cell 105 may be written by applying one of two voltages (e.g., a voltage above a threshold or a voltage below a threshold) to memory cell 105 to store, or not store, an electric charge on the charge trapping structure 120 and thereby cause the memory cell 105 store one of two possible logic values. For example, when a first voltage is applied to the control node 140 (e.g., via a word line 165) relative to a bulk node 145 (e.g., a body node) for the transistor 110 (e.g., when the control node 140 is at a higher voltage than the bulk), electrons may tunnel into the charge trapping structure 120. Injection of electrons into the charge trapping structure 120 may be referred to as programming the memory cell 105 and may occur as part of a write operation. A programmed memory cell may, in some cases, be considered as storing a logic 0. When a second voltage is applied to the control node 140 (e.g., via the word line 165) relative to the bulk node 145 for the transistor 110 (e.g., when the control node 140 is at a lower voltage than the bulk node 145), electrons may leave the charge trapping structure 120. Removal of electrons from the charge trapping structure 120 may be referred to as erasing the memory cell 105 and may occur as part of an erase operation. An erased memory cell may, in some cases, be considered as storing a logic 1. In some cases, memory cells 105 may be programmed at a page level of granularity due to memory cells 105 of a page sharing a common word line 165, and memory cells 105 may be erased at a block level of granularity due to memory cells 105 of a block sharing commonly biased bulk nodes 145.

In contrast to writing an SLC memory cell 105, writing a multiple-level (e.g., MLC, TLC, or QLC) memory cell 105 may involve applying different voltages to the memory cell 105 (e.g., to the control node 140 or bulk node 145 thereof) at a finer level of granularity to more finely control the amount of charge stored on the charge trapping structure 120, thereby enabling a larger set of logic values to be represented. Thus, multiple-level memory cells 105 may provide greater density of storage relative to SLC memory cells 105 but may, in some cases, involve narrower read or write margins or greater complexities for supporting circuitry.

A charge-trapping NAND memory cell 105 may operate similarly to a floating-gate NAND memory cell 105 but, instead of or in addition to storing a charge on a charge trapping structure 120, a charge-trapping NAND memory cell 105 may store a charge representing a logic state in a dielectric material between the control gate 115 and a channel (e.g., a channel between a first node 130 and a second node 135). Thus, a charge-trapping NAND memory cell 105 may include a charge trapping structure 120, or may implement charge trapping functionality in one or more portions of dielectric material 125, among other configurations.

In some examples, each page of memory cells 105 may be connected to a corresponding word line 165, and each column of memory cells 105 may be connected to a corresponding bit line 155 (e.g., digit line). Thus, one memory cell 105 may be located at the intersection of a word line 165 and a bit line 155. This intersection may be referred to as an address of a memory cell 105. In some cases, word lines 165 and bit lines 155 may be substantially perpendicular to one another, and may be generically referred to as access lines or select lines.

In some cases, a memory device 100 may include a three-dimensional (3D) memory array, where multiple two-dimensional (2D) memory arrays may be formed on top of one another. In some examples, such an arrangement may increase the quantity of memory cells 105 that may be fabricated on a single die or substrate as compared with 1D arrays, which, in turn, may reduce production costs, or increase the performance of the memory array, or both. In the example of FIG. 1, memory device 100 includes multiple levels (e.g., decks, layers, planes, tiers) of memory cells 105. The levels may, in some examples, be separated by an electrically insulating material. Each level may be aligned or positioned so that memory cells 105 may be aligned (e.g., exactly aligned, overlapping, or approximately aligned) with one another across each level, forming a memory cell stack 175. In some cases, memory cells aligned along a memory cell stack 175 may be referred to as a string of memory cells 105 (e.g., as described with reference to FIG. 2).

Accessing memory cells 105 may be controlled through a row decoder 160 and a column decoder 150. For example, the row decoder 160 may receive a row address from the memory controller 180 and activate an appropriate word line 165 based on the received row address. Similarly, the column decoder 150 may receive a column address from the memory controller 180 and activate an appropriate bit line 155. Thus, by activating one word line 165 and one bit line 155, one memory cell 105 may be accessed. As part of such accessing, a memory cell 105 may be read (e.g., sensed) by sense component 170. For example, the sense component 170 may be configured to determine the stored logic value of a memory cell 105 based on a signal generated by accessing the memory cell 105. The signal may include a current, a voltage, or both a current and a voltage on the bit line 155 for the memory cell 105 and may depend on the logic value stored by the memory cell 105. The sense component 170 may include various circuitry (e.g., transistors, amplifiers) configured to detect and amplify a signal (e.g., a current or voltage) on a bit line 155. The logic value of memory cell 105 as detected by the sense component 170 may be output via input/output component 190. In some cases, a sense component 170 may be a part of a column decoder 150 or a row decoder 160, or a sense component 170 may otherwise be connected to or in electronic communication with a column decoder 150 or a row decoder 160.

A memory cell 105 may be programmed or written by activating the relevant word line 165 and bit line 155 to enable a logic value (e.g., representing one or more bits of information) to be stored in the memory cell 105. A column decoder 150 or a row decoder 160 may accept data (e.g., from the input/output component 190) to be written to the memory cells 105. In the case of NAND memory, a memory cell 105 may be written by storing electrons in a charge trapping structure or an insulating layer.

A memory controller 180 may control the operation (e.g., read, write, re-write, refresh) of memory cells 105 through the various components (e.g., row decoder 160, column decoder 150, sense component 170). In some cases, one or more of a row decoder 160, a column decoder 150, and a sense component 170 may be co-located with a memory controller 180. A memory controller 180 may generate row and column address signals in order to activate a desired word line 165 and bit line 155. In some examples, a memory controller 180 may generate and control various voltages or currents used during the operation of memory device 100.

In some examples, aspects of the memory device 100 may be formed by first depositing a stack of alternating materials. The stack of materials may include, for example, alternating layers of a polysilicon material and an oxide material. A trench may be formed (e.g., etched) in the stack of materials and doped using a plasma doping process. The plasma doping process may include applying Boron fluoride, diborane, methane, or Boron and Carbon Hydride gases diluted with Hydrogen ($H_2$) or Helium to the sidewalls and bottom surface of the trench, which may dope portions of the polysilicon material with Boron, Carbon, Fluorine, Helium, or Hydrogen. Additionally or alternatively, a single photoresist layer may be deposited above the stack prior to doping the trench (or prior to filling the trench with a dielectric material). Accordingly, as described herein, trenches within a stack of materials may be doped using relatively few processing steps, which may increase overall manufacturing efficiency and decrease processing time and fabrication costs for the memory device 100.

FIG. 2 illustrates an example of a memory architecture 200 that supports plasma-doped trenches for memory in accordance with examples as disclosed herein. The memory architecture 200 may be an example of a portion of a memory device, such as a memory device 100. Although some elements of a set of elements (e.g., an array of elements) are included in FIG. 2, some elements may be omitted for the sake of visibility and clarity of the depicted elements. Moreover, although some elements included in FIG. 2 are labeled with reference numbers, some other corresponding elements are not labeled, though they are the same or would be understood by a person having ordinary skill in the art to be similar. Aspects of the memory architecture 200 may be described with reference to an x-direction, a y-direction, and a z-direction of the illustrated coordinate system.

The memory architecture 200 includes a three-dimensional array of memory cells 205, which may be examples of memory cells 105 described with reference to FIG. 1 (e.g., transistors 110, NAND memory cells). In some examples, the memory cells 205 may be connected in a 3D NAND configuration. For example, the memory cells 205 may be included in a block 210, which may be arranged as a 3D array of m memory cells along the x-direction, n memory cells along the y-direction, and o memory cells along the z-direction. Each memory cell 205 may be located (e.g., addressed) in accordance with an index i along the x-direction, an index j along the y-direction, and an index k along the z-direction (e.g., for locating a memory cell 205-*a-ijk*). A memory device 100 may include any quantity of one or more blocks 210 in accordance with examples as disclosed herein, and different blocks 210 may be adjacent along the x-direction, along the y-direction, or along the z-direction, or any combination thereof.

In the example of memory architecture 200, the block 210 may be divided into a set of pages 215 (e.g., a quantity of o pages 215) along the z-direction, including a page 215-*a-l* associated with memory cells 205-*a*-111 through 205-*a-mn*1. In some examples, each page 215 may be associated with a same word line 265, (e.g., a word line 165 described with reference to FIG. 1), which may be coupled with a control gate 115 of each of the memory cells 205 of the page 215. For example, page 215-*a-l* may be associated with a word line 265-*a-l*, and other pages 215-*a-i* may be associated with a different respective word line 265-*a-i* (not shown). In some examples, a word line 265 in accordance with the memory architecture 200 may be implemented as planar conductor (e.g., in an xy-plane) that is coupled with each of the memory cells 205 of the page 215.

In the example of memory architecture 200, the block 210 also may be divided into a set of strings 220 (e.g., a quantity of (m×n) strings 220) in an xy-plane, including a string 220-*a-mn* associated with memory cells 205-*a-mn*1 through 205-*a-mno*. In some examples, each string 220 may include a set of memory cells 205 connected in series (e.g., along the z-direction, in which a drain of one memory cell 205 in the string 220 may be coupled with a source of another memory cell 205 in the string 220). In some examples, memory cells 205 of a string 220 may be implemented along a common channel, such as a pillar channel (e.g., a columnar channel, a pillar of doped semiconductor) along the z-direction. Each memory cell 205 in a string 220 may be associated with a different word line 265, such that a quantity of word lines 265 in the memory architecture 200 may be equal to the quantity of memory cells 205 in a string 220. Accordingly, a string 220 may include memory cells 205 from multiple pages 215, and a page 215 may include memory cells 205 from multiple strings 220.

In some examples, memory cells 205 may be programmed (e.g., set to a logic 0 value) and read from in accordance with a granularity, such as at the granularity of the page 215, but may not be erasable (e.g., reset to a logic 1 value) in accordance with the granularity, such as the granularity of the page 215. For example, NAND memory may instead be erasable in accordance with a different (e.g., higher) level of granularity, such as at the level of granularity the block 210. In some cases, a memory cell 205 may be erased before it may be re-programmed. Different memory devices may have different read, write, or erase characteristics.

In some examples, each string 220 of a block 210 may be coupled with a respective transistor 230 (e.g., a string select transistor, a drain select transistor) at one end of the string 220 (e.g., along the z-direction) and a respective transistor 240 (e.g., a source select transistor, a ground select transistor) at the other end of the string 220. In some examples, a drain of each transistor 230 may be coupled with a bit line 250 of a set of bit lines 250 associated with the block 210, where the bit lines 250 may be examples of bit lines 155 described with reference to FIG. 1. A gate of each transistor 230 may be coupled with a select line 235 (e.g., a string select line, a drain select line). Thus, a transistor 230 may be used to couple a string 220 with a bit line 250 based on applying a voltage to the select line 235, and thus to the gate of the transistor 230. Although illustrated as separate lines along the x-direction, in some examples, select lines 235 may be common to all the transistors 230 associated with the block 210 (e.g., a commonly biased string select node). For example, like the word lines 265 of the block 210, select lines 235 associated with the block 210 may, in some examples, be implemented as a planar conductor (e.g., in an xy-plane) that is coupled with each of the transistors 230 associated with the block 210.

In some examples, a source of each transistor 240 associated with the block 210 may be coupled with a source line 260 of a set of source lines 260 associated with the block 210. In some examples, the set of source lines 260 may be associated with a common source node (e.g., a ground node) corresponding to the block 210. A gate of each transistor 240 may be coupled with a select line 245 (e.g., a source select line, a ground select line). Thus, a transistor 240 may be used to couple a string 220 with a source line 260 based on applying a voltage to the select line 245, and thus to the gate of the transistor 240. Although illustrated as separate lines along the x-direction, in some examples, select lines 245 also may be common to all the transistors 240 associated with the block 210 (e.g., a commonly biased ground select node). For example, like the word lines 265 of the block 210, select lines 245 associated with the block 210 may, in some examples, be implemented as a planar conductor (e.g., in an xy-plane) that is coupled with each of the transistors 240 associated with the block 210.

To operate the memory architecture 200 (e.g., to perform a program operation, a read operation, or an erase operation on one or more memory cells 205 of the block 210), various voltages may be applied to one or more select lines 235 (e.g., to the gate of the transistors 230), to one or more bit lines 250 (e.g., to the drain of one or more transistors 230), to one or more word lines 265, to one or more select lines 245 (e.g., to the gate of the transistors 240), to one or more source lines 260 (e.g., to the source of the transistors 240), or to a bulk for the memory cells 205 (not shown) of the block 210. In some cases, each memory cell 205 of a block 210 may have a common bulk, the voltage of which may be controlled independently of bulks for other blocks 210.

In some cases, as part of a read operation for a memory cell 205, a positive voltage may be applied to the corresponding bit line 250 while the corresponding source line 260 may be grounded or otherwise biased at a voltage lower than the voltage applied to the bit line 250. In some examples, voltages may be concurrently applied to the select line 235 and the select line 245 that are above the threshold voltages of the transistor 230 and the transistor 240, respectively, for the memory cell 205, thereby activating the transistor 230 and transistor 240 such that a channel associated with the string 220 that includes the memory cell 205 (e.g., a pillar channel) may be electrically connected with (e.g., electrically connected between) the corresponding bit line 250 and source line 260. A channel may be an electrical path through the memory cells 205 in the string 220 (e.g., through the sources and drains of the transistors in the memory cells 205 of the string 220) that may conduct current under some operating conditions.

In some examples, multiple word lines 265 (e.g., in some cases all word lines 265) of the block 210—except a word line 265 associated with a page 215 of the memory cell 205 to be read—may concurrently be set to a voltage (e.g., VREAD) that is higher than the threshold voltage (VT) of the memory cells 205. VREAD may cause all memory cells 205 in the unselected pages 215 be activated so that each unselected memory cell 205 in the string 220 may maintain high conductivity within the channel. In some examples, the word line 265 associated with the memory cell 205 to be read may be set to a voltage, VTarget. Where the memory cells 205 are operated as SLC memory cells, VTarget may be a voltage that is between (i) VT of a memory cell 205 in an erased state and (ii) VT of a memory cell 205 in a programmed state.

When the memory cell 205 to be read exhibits an erased VT (e.g., VTarget>VT of the memory cell 205), the memory cell 205 may turn "ON" in response to the application of VTarget to the word line 265 of the selected page 215, which may allow a current to flow in the channel of the string 220, and thus from the bit line 250 to the source line 260. When the memory cell 205 to be read exhibits a programmed VT (e.g., VTarget<VT of the selected memory cell), the memory cell 205 may remain "OFF" despite the application of VTarget to the word line 265 of the selected page 215, and thus may prevent a current from flowing in the channel of the string 220, and thus from the bit line 250 to the source line 260.

A signal on the bit line 250 for the memory cell 205 (e.g., an amount of current below or above a threshold) may be sensed (e.g., by a sense component 170 as described with reference to FIG. 1), and may indicate whether the memory cell 205 became conductive or remained non-conductive in response to the application of VTarget to the word line 265 of the selected page 215. The sensed signal thus may be indicative of whether the memory cell 205 was in an erased state (e.g., storing a logic 1) or a programmed state (e.g., storing a logic 0). Though aspects of the example read operation above have been explained in the context of an SLC memory cell 205 for clarity, such techniques may be extended or altered and applied in the context of a multiple-level memory cell 205 (e.g., through the use of multiple values of VTarget corresponding to the different amounts of charge that may be stored in one multiple-level memory cell 205).

In some cases, as part of a program operation for a memory cell 205, charge may be added to a portion of the memory cell 205 such that current flow through the memory cell 205, and thus the corresponding string 220, may be inhibited when the memory cell 205 is later read. For example, charge may be injected into a charge trapping structure 120 as shown in memory cell 105-a of FIG. 1. In some cases, respective voltages may be applied to the word line 265 of the page 215 and the bulk of the memory cell 205 to be programmed such that a control gate 115 of the memory cell 205 is at a higher voltage than the bulk of the memory cell 205 (e.g., a positive voltage may be applied to the word line). Concurrently, voltages may be applied to the select line 235 and the select line 245 that are above the threshold voltages of the transistor 230 and the transistor 240, respectively, thereby activating the transistor 230 and the transistor 240, and the bit line 250 for the memory cell 205 to be programmed may be set to a relatively high voltage. This may cause an electric field such that electrons are pulled from the source of the memory cell 205 towards the drain. The electric field may also cause some of these electrons to be pulled through dielectric material 125 and thereby injected into the charge trapping structure 120 of the memory cell 205, through a process which may in some cases be referred to as tunnel injection.

In some cases, a single program operation may program some or all memory cells 205 in a page 215, as the memory cells 205 of the page 215 may all share a common word line 265 and a common bulk. For a memory cell 205 of the page 215 for which it is not desired to write a logic 0 (e.g., not desired to program the memory cell 205), the corresponding bit line 250 may be set to a relatively low voltage (e.g., ground), which may inhibit the injection of electrons into a charge trapping structure 120. Though aspects of the example program operation above have been explained in the context of an SLC memory cell 205 for clarity, such techniques may be extended and applied to the context of a multiple-level memory cell 205 (e.g., through the use of multiple programming voltages applied to the word line 265, or multiple passes or pulses of a programming voltage applied to the word line 265, corresponding to the different amounts of charge that may be stored in one multiple-level memory cell 205).

In some cases, as part of an erase operation for a memory cell 205, charge may be removed from a portion of the memory cell 205 such that current flow through the memory cell 205, and thus the corresponding string 220, may be uninhibited (e.g., allowed, at least to a greater extent) when the memory cell 205 is later read. For example, charge may be removed from a charge trapping structure 120 as shown in memory cell 105-a of FIG. 1. In some cases, respective voltages may be applied to the word line 265 of the page 215 and the bulk of the memory cell 205 to be erased such that a control gate 115 of the memory cell 205 is at a lower voltage than the bulk of the memory cell 205 (e.g., a positive voltage may be applied to the bulk), which may cause an electric field that pulls electrons out of the charge trapping structure 120 and into the bulk of the memory cell 205. In some cases, a single program operation may erase all memory cells 205 in a block 210, as the memory cells 205 of the block 210 may all share a common bulk.

In some examples, aspects of the memory architecture 200 may be formed by first depositing a stack of alternating materials. The stack of materials may include, for example, alternating layers of a polysilicon material and an oxide material. A trench may be formed (e.g., etched) in the stack of materials and doped using a plasma doping process. The plasma doping process may include applying Boron fluoride, diborane, methane, or Boron and Carbon Hydride gases diluted with Hydrogen ($H_2$) or Helium to the sidewalls and bottom surface of the trench, which may dope portions of the polysilicon material with Boron, Carbon, Fluorine, Helium, or Hydrogen. Additionally or alternatively, a single photoresist layer may be deposited above the stack prior to doping the trench (or prior to filling the trench with a dielectric material). Accordingly, as described herein, trenches within a stack of materials may be doped using relatively few processing steps, which may increase overall manufacturing efficiency and decrease processing time and fabrication costs for the memory architecture 200.

FIGS. 3A through 3F illustrate examples of processing steps 300 that support plasma-doped trenches for memory in accordance with examples as disclosed herein. The processing steps 300 may illustrate aspects of a sequence of manufacturing operations for fabricating aspects of a memory device 100 described with reference to FIG. 1. For illustrative purposes, aspects of the memory device may be described with reference to an x-direction, a y-direction (e.g., into the page), and/or a z-direction of the illustrated coordinate system. For example, the processing steps 300 may illustrate various cross-sectional views of the memory device in an xz-plane. In some examples, the z-direction may be illustrative of a direction (e.g., a vertical direction, a layer direction) orthogonal to a surface of a substrate (e.g., a surface in an xy-plane, a surface upon or over which other materials may be deposited), and each of the related regions, illustrated by their respective cross section in the xz-plane, may extend for some distance along the y-direction (e.g., above or on the substrate). Although the processing steps 300 illustrate examples of relative dimensions and quantities of various features, aspects of the memory device may be implemented with other relative dimensions or quantities of such features in accordance with examples as disclosed herein.

Operations illustrated in and described with reference to FIGS. 3A through 3F may be performed by a manufacturing system, such as a semiconductor fabrication system configured to perform additive operations such as deposition or bonding, subtractive operations such as etching, trenching, planarizing, or polishing, and supporting operations such as masking, patterning, photolithography, or aligning, among other operations that support the described techniques. In some examples, operations performed by such a manufacturing system may be supported by a process controller or its components as described herein. As described herein, trenches may be formed within a stack of materials and may be doped using relatively few processing steps, which may increase overall manufacturing efficiency and decrease processing time and fabrication costs for the memory device.

Figure 3A:
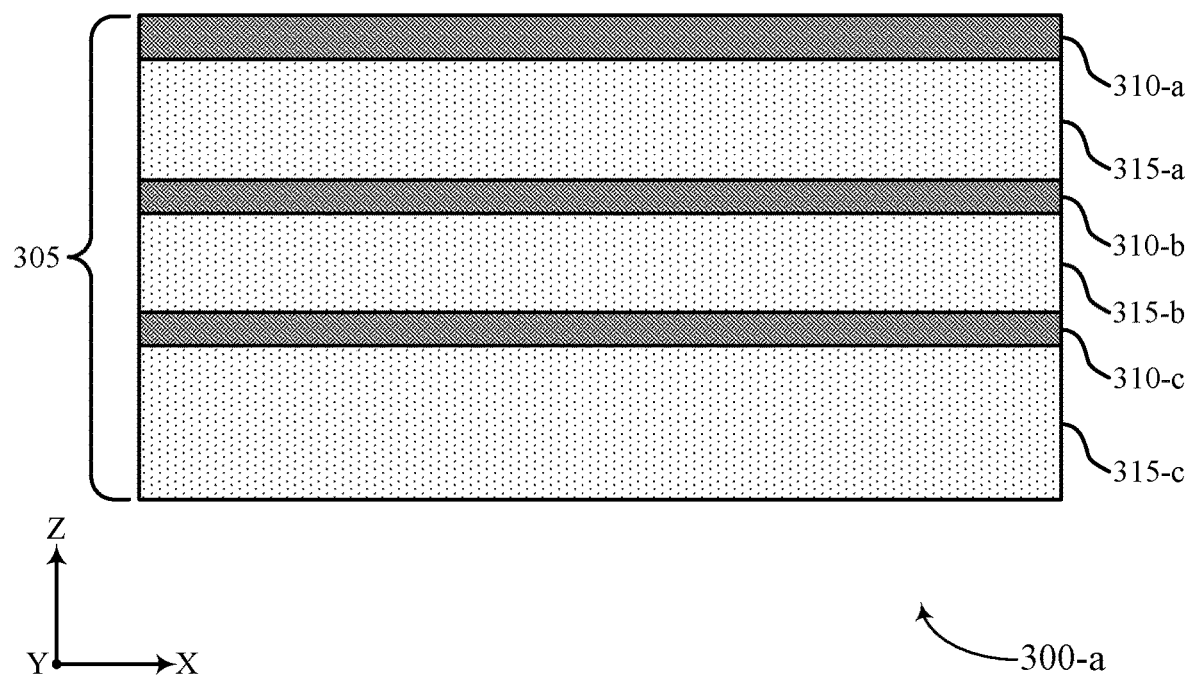
FIG. 3A-3F illustrate examples of processing steps that support plasma-doped trenches for memory in accordance with examples as disclosed herein.
Figure 3B:
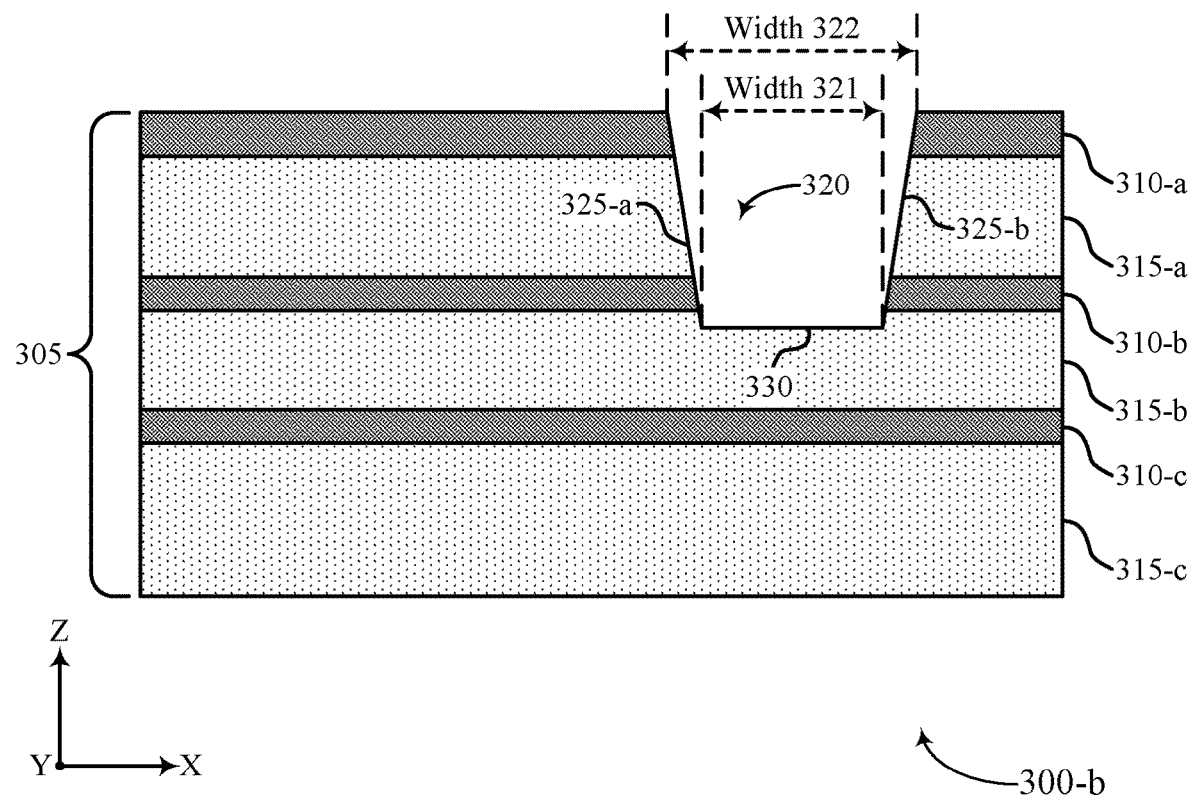

FIG. 3A illustrates a first processing step 300-a for forming plasma-doped trenches. In some examples, the first processing step 300-a may include forming (e.g., depositing) a stack of materials 305. The stack of materials 305 may include one or more alternating layers of material formed above a substrate (not shown). The stack of materials 305 may include alternating layers of an oxide material 310 (e.g., tetraethyl orthosilicate (TEOS)) and a polysilicon material 315. In some cases, the stack of materials 305 may have been formed such that each material is generally coplanar in an xy-plane, and the layers may be stacked in the z-direction (e.g., the layers may be formed one above another in the z-direction).

Although FIG. 3A illustrates three layers of an oxide material (e.g., oxide material 310-a, oxide material 310-b, oxide material 310-c), any layers of oxide material may be included in the stack of materials 305. Additionally or alternatively, although FIG. 3A illustrates three layers of a polysilicon material (e.g., polysilicon material 315-a, polysilicon material 315-b, polysilicon material 315-c), any layers of polysilicon material may be included in the stack of materials 305. In some examples, a bottom surface of the polysilicon material 315-c may be in contact with a substrate (not shown) and an upper surface of the oxide material 310-a may be exposed. In some cases, the layers of the oxide material 310 and the polysilicon material 315 may have been formed such that each layer was deposited and planarized prior to deposition of the subsequent layer.

In some cases, each layer of the polysilicon material 315 may have a different thicknesses. For example, the first layer of polysilicon material 315-a may have a first thickness (e.g., 800 A), the second layer of polysilicon material 315-b may have a second thickness (e.g., 500 A), and the third layer of polysilicon material 315-c may have a third thickness (e.g., 1500 A). In other examples, the thickness of one or more layers of polysilicon material 315 may be a same or similar thickness, and the thickness of each layer may be selected as a matter of design choice.

Additionally or alternatively, one or more layers of the oxide material 310 may have a different thicknesses. For example, the first layer of oxide material 310-a may have a first thickness (e.g., 300 A), and the second layer of oxide material 315-b and the third layer of oxide material 310-c may have a second thickness (e.g., 120 A). In other examples, the thickness of one or more layers of oxide material 310 may be a same or similar thickness, and the thickness of each layer may be selected as a matter of design choice and may range between approximately 50 A and 300 A.

FIG. 3A illustrates a second processing step 300-b for forming plasma-doped trenches. In some examples, the second processing step 300-b may include forming a trench 320 (e.g., a recess, a cavity) in the stack of materials 305. The trench 320 may have been formed by removing portions of the layers of the polysilicon material 315 and the oxide material 310 using an etching process (e.g., a wet etching process, a dry etching process). For example, the stack of materials 305 may have been subject to a dry etch process to remove a portion of the first layer of oxide material 310-a, a portion of the first layer of polysilicon material 315-a, a portion of the second layer of oxide material 310-b, and a portion of the second layer of polysilicon material 315-b. The trench 320 may have been formed such that it has a tapered shape, where a dimension 321 (e.g., a width 321) of its bottom surface (e.g., along the x-direction) may be less than a dimension 322 (e.g., a width 322) of its upper surface.

Removing portions of the layers of the polysilicon material 315 and the oxide material 310 to form the trench 320 may expose one or more surfaces (e.g., sidewalls) of the layers of the polysilicon material 315 and the oxide material 310. For example, a first sidewall 325-a of the trench 320 may include exposed surfaces (e.g., exposed sidewalls) of the first layer of oxide material 310-a, the first layer of polysilicon material 315-a, the second layer of oxide material 310-b, and the second layer of polysilicon material 315-b. Additionally or alternatively, a second sidewall 325-b of the trench 320 may include exposed surfaces (e.g., exposed sidewalls) of the first layer of oxide material 310-a, the first layer of polysilicon material 315-a, the second layer of oxide material 310-b, and the second layer of polysilicon material 315-b. The bottom surface 330 of the trench 320 may include an exposed surface (e.g., an exposed upper surface) of the second polysilicon material.

Figure 3C:
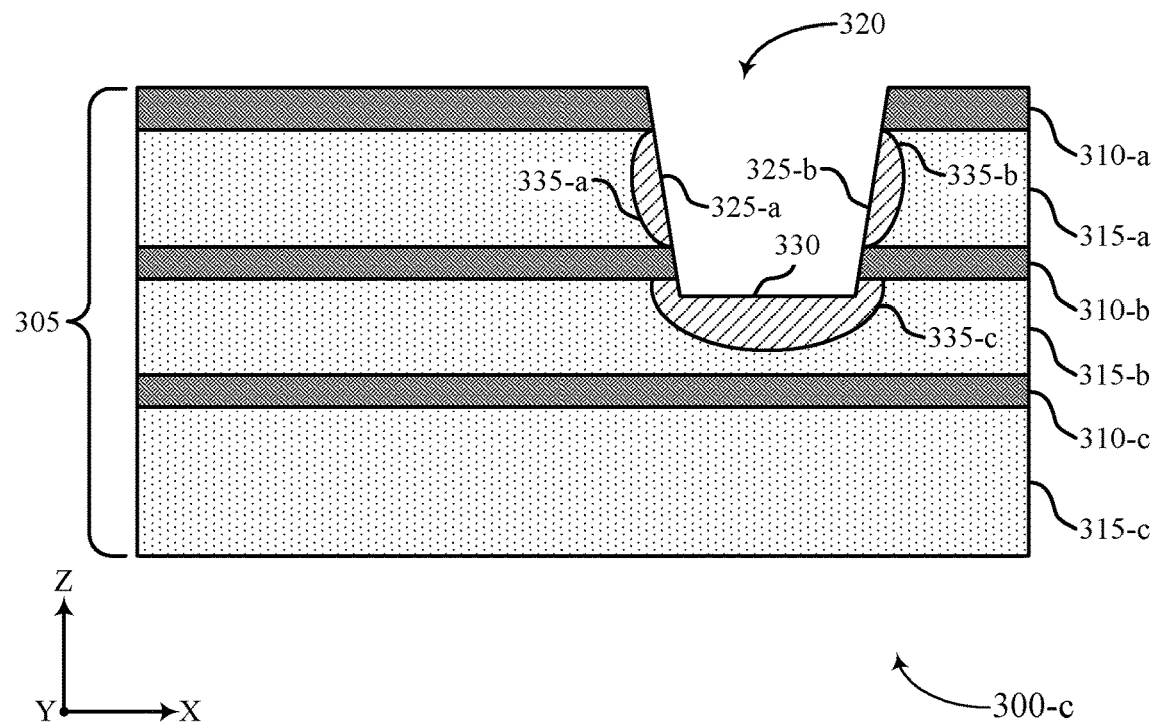

FIG. 3C illustrates a third processing step 300-c for forming plasma-doped trenches. In some examples, the third processing step 300-c may include doping the trench 320 (e.g., implanting the trench 320 with a dopant). For example, the dopant may be applied within the trench 320 such that the first sidewall 325-a, the second sidewall 325-b, and the bottom surface 330 are doped. The trench 320 may be doped using a plasma doping process that includes applying Boron fluoride, diborane, methane, or Boron and Carbon Hydride gases diluted with Hydrogen ($H_2$) or Helium to the trench 320. That is, the dopant may be applied to portions of the first sidewall 325-a, the second sidewall 325-b, and the bottom surface 330, such that exposed surfaces (e.g., exposed sidewalls) of the first polysilicon material 315-a and the second polysilicon material 315-b are doped.

For example, the first polysilicon material 315-a and the second polysilicon material 315-b may have a chemical property (or properties) that are susceptible to doping. Accordingly, the doped first polysilicon material 315-a and second polysilicon material 315-b may include a concentration of Boron, Carbon, Fluorine, Helium, or Hydrogen at or relatively near the first sidewall 325-a, the second sidewall 325-b, and the bottom surface 330 of the trench. Additionally or alternatively, the first oxide material 310-a and the second oxide material 310-b may have a chemical property (or properties) that are less susceptible (e.g., not susceptible) to doping and thus may not include a concentration of Boron, Carbon, Fluorine, Helium, or Hydrogen at or relatively near the first sidewall 325-a and the second sidewall 325-b.

In some examples, the concentration of Boron, Carbon, Fluorine, Helium, or Hydrogen may decrease in a first direction (e.g., in the x-direction) away from the first sidewall 325-a, in a second direction (e.g., in the x-direction) away from the second sidewall 325-b, and in a third direction (e.g., in the z-direction) away from the bottom surface 330. That is, the highest concentration of Boron, Carbon, Fluorine, Helium, or Hydrogen may exist at or relatively near the first sidewall 325-a, the second sidewall 325-b, and the bottom surface 330 and the lowest concentration of Boron, Carbon, Fluorine, Helium, or Hydrogen may exist relatively far from the first sidewall 325-a, the second sidewall 325-b, and the bottom surface 330.

For example, one or more gradients 335 of Boron, Carbon, Fluorine, Helium, or Hydrogen may exist within the first polysilicon material 315-a and the second polysilicon material 315-b. The first layer of polysilicon material 315-a may include a first gradient 335-a and a second gradient 335-b, and the second layer of polysilicon material 315-b may include a third gradient 335-c. As described herein, the gradient may be such that the concentration of Boron, Carbon, Fluorine, Helium, or Hydrogen may decrease (e.g., logarithmically decrease) in respective directions away from the first sidewall 325-a, the second sidewall 325-b, and the bottom surface 330. In some cases, a duration for which the dopant is applied or a concentration of the dopant applied to the trench 320 may affect the concentration of Boron, Carbon, Fluorine, Helium, or Hydrogen in the layers of polysilicon material 315. For example, applying a dopant for a relatively long duration or applying a relatively concentrated dopant may result in the concentration of Boron, Carbon, Fluorine, Helium, or Hydrogen being relatively greater.

Figure 3D:
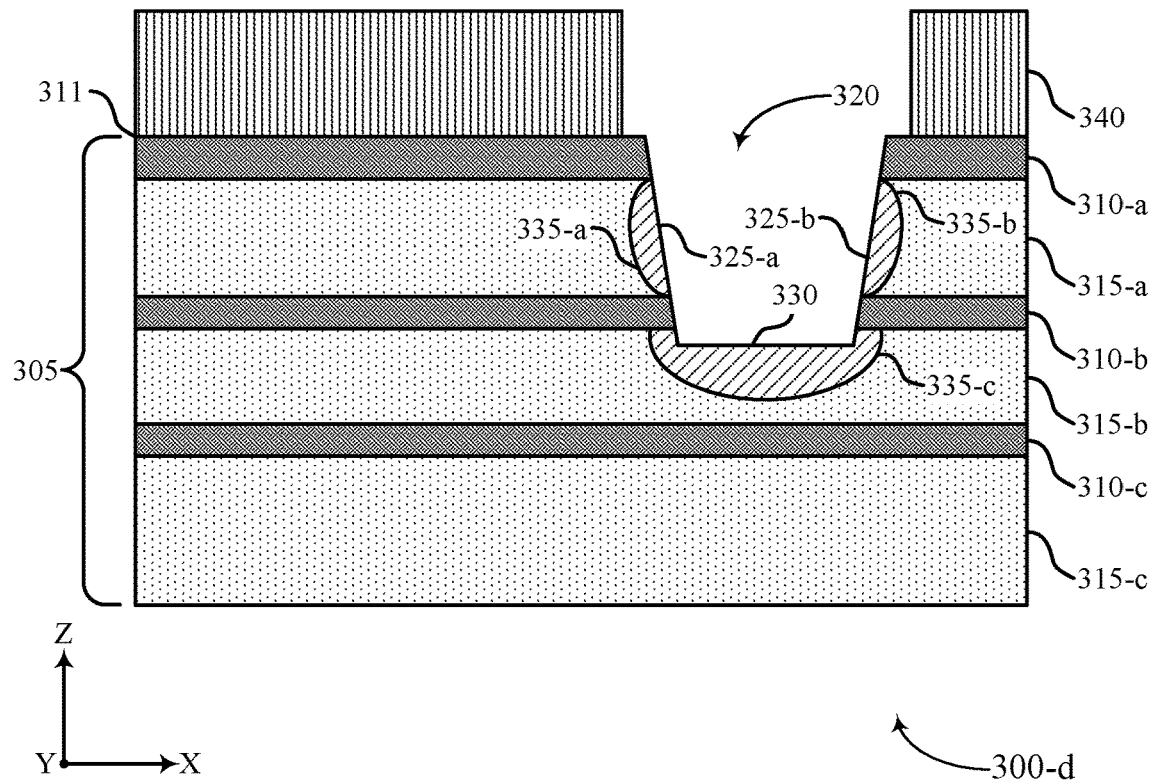

FIG. 3D illustrates a fourth processing step 300-*d* for forming plasma-doped trenches. In some examples, the fourth processing step 300-*d* may include depositing a photoresist material 340 above the stack of materials 305. The photoresist material 340 may have been deposited on an upper surface 311 of the first layer of oxide material 310-*a*. In some cases, the photoresist material 340 may be deposited to protect the first layer of oxide material 310-*a* or otherwise facilitate one or more subsequent processing steps 300. For example, the photoresist material 340 may be deposited to protect the first layer of oxide material 310-*a* or otherwise facilitate the filling of the trench 320. In other examples, the photoresist material 340 may have been deposited above the stack of materials 305 during or before a prior processing step 300 (e.g., during or before processing step 300-*c*) to protect the first layer of oxide material 310-*a* during the doping process.

Figure 3E:
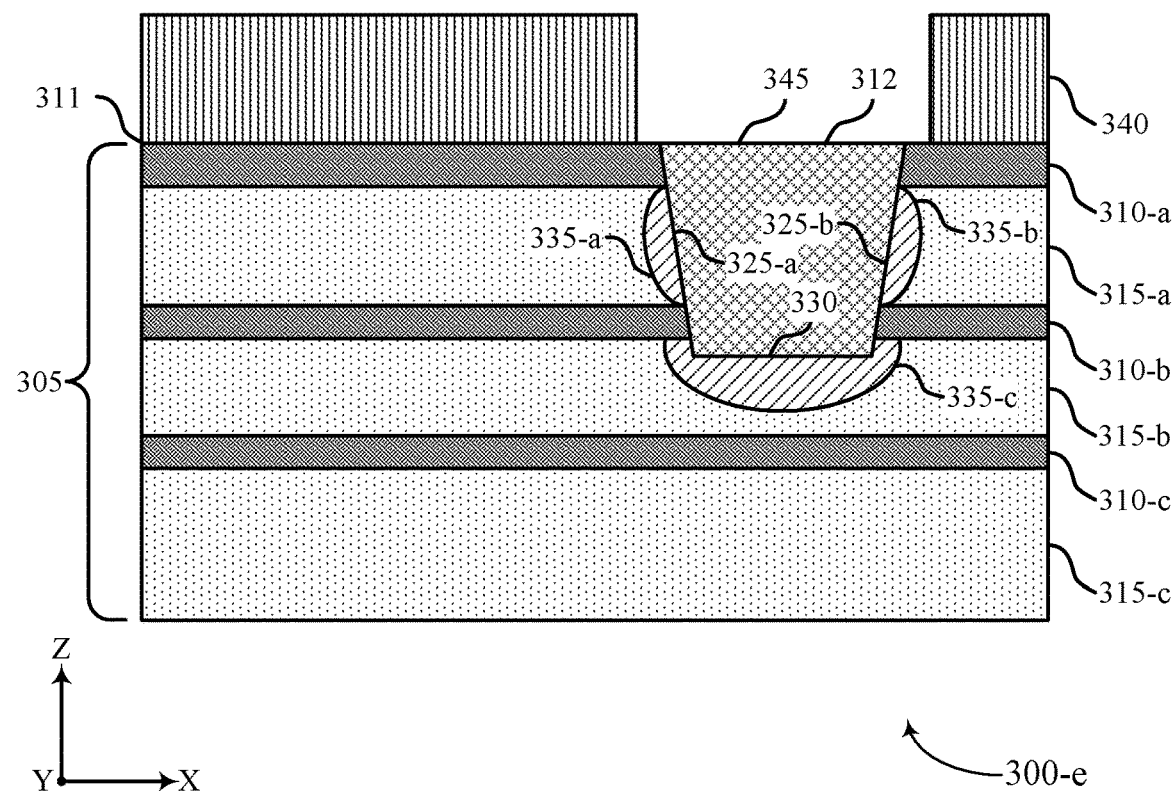

FIG. 3E illustrates a fifth processing step 300-*e* for forming plasma-doped trenches. In some examples, the fifth processing step 300-*e* may include filling the trench 320 with a dielectric material 345. In some examples, the filled trench 320 may be referred to as a plug (e.g., a conductive plug). In some examples, the dielectric material 345 may have been deposited into the trench 320 such that an upper surface 312 of the dielectric material 345 is generally coplanar with the upper surface 311 of the first oxide material 310-*a*. In other examples, the upper surface 312 of the dielectric material 345 may extend above the upper surface 311 of the first oxide material 310-*a* (e.g., until a subsequent planarization operation is performed).

The dielectric material 345 may be deposited in the trench 320 such that it is in contact with (e.g., conformal with) the first sidewall 325-*a*, the second sidewall 325-*b*, and the bottom surface 330 of the trench 320. In some cases, during the processing step 300-*e*, a liner may have been formed in the trench 320 prior to depositing the dielectric material 345. For example, the liner may have been deposited in the trench 320 such that it is in contact with (e.g., conformal with) the first sidewall 325-*a*, the second sidewall 325-*b*, and the bottom surface 330 of the trench 320 and the dielectric material 345 may be deposited such that it is in contact with the liner. In some examples, the liner may be an oxide material that is a same or a different material (e.g., a same or a different oxide material) than the oxide material 310.

Figure 3F:
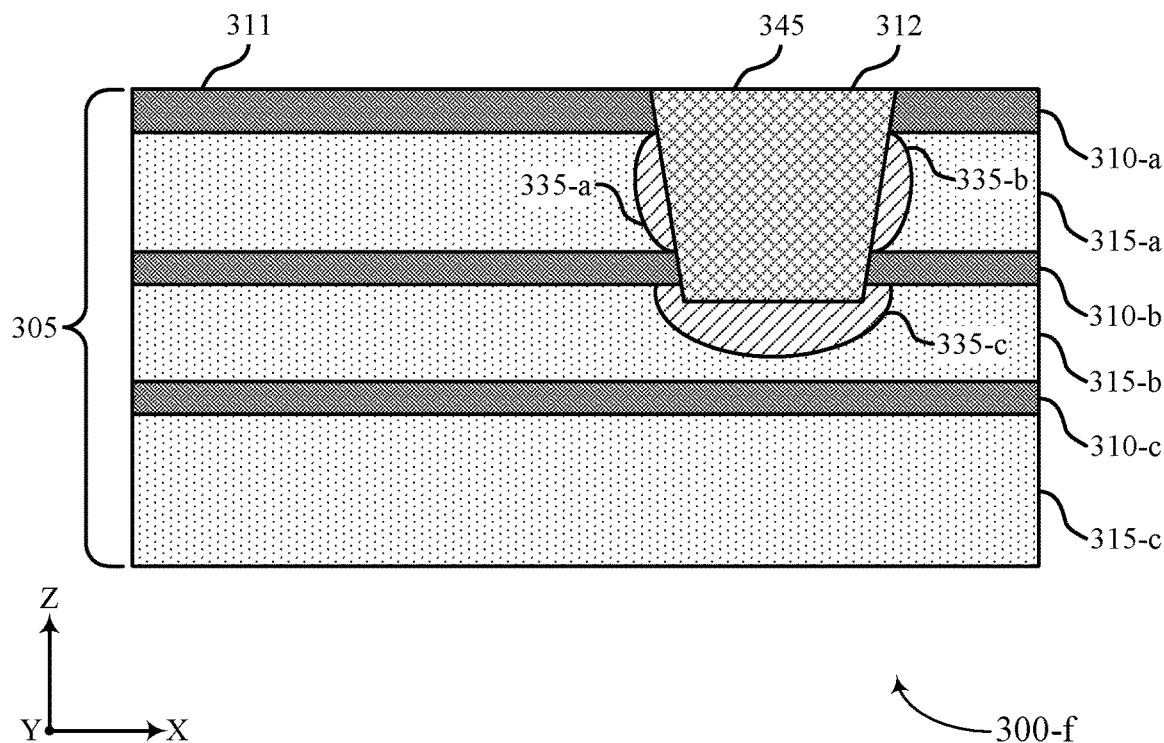

FIG. 3F illustrates a sixth processing step 300-*f* for forming plasma-doped trenches. In some examples, the sixth processing step 300-*f* may include removing the photoresist material 340. For example, the sixth processing step 300-*f* may include planarizing the stack of materials 305 to remove the photoresist material 340 and any dielectric material 345 extending above the upper surface 311 of the first oxide material 310-*a*. That is, the upper surface 311 of the first oxide material 310-*a* and the upper surface 312 of the dielectric material 345 may be coplanar after being planarized. Accordingly, as described herein, the trench 320 within the stack of materials 305 may be doped using relatively few processing steps, which may increase overall manufacturing efficiency and decrease processing time and fabrication costs for the associated memory device.

Figure 4:
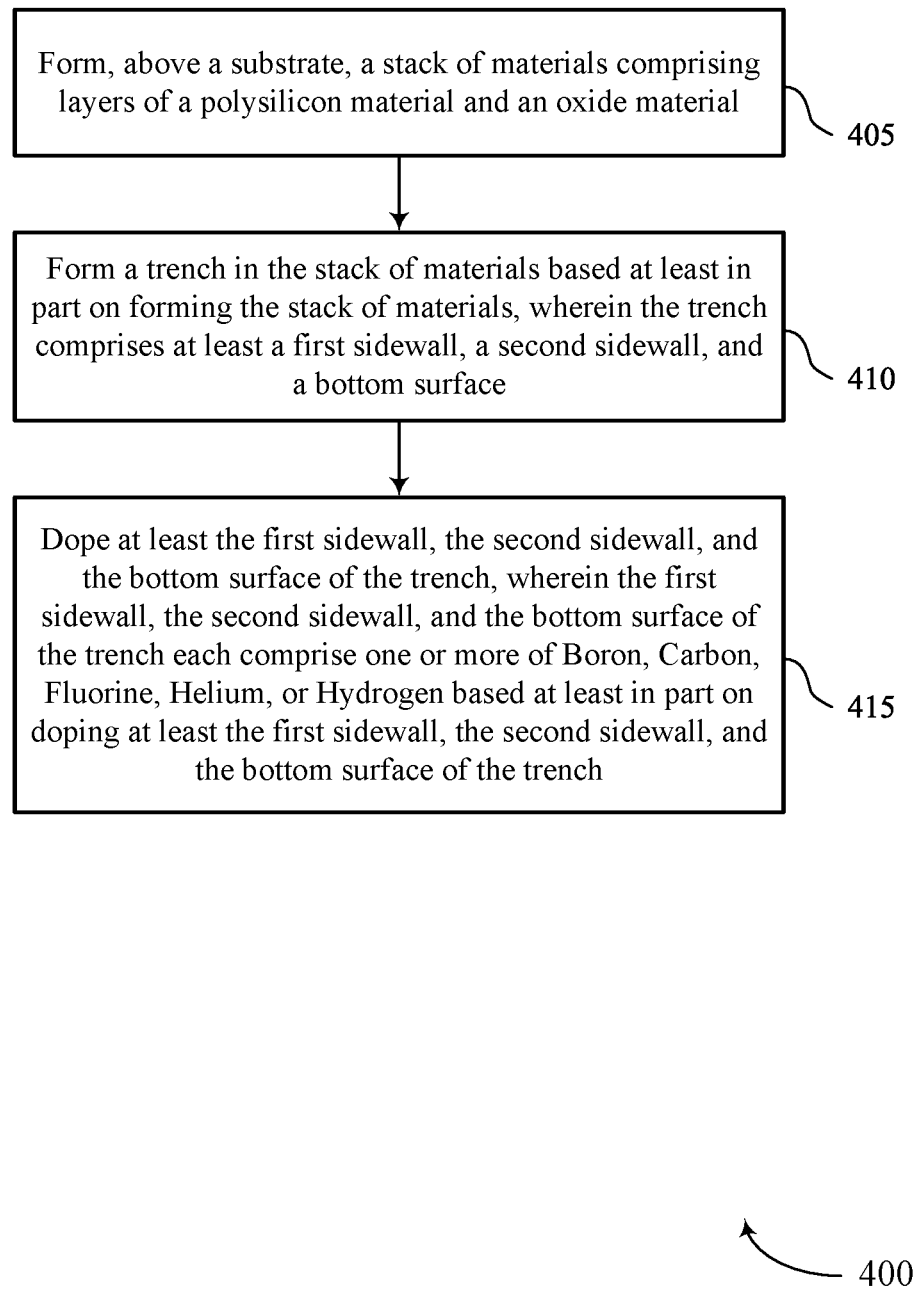
FIG. 4 shows a flowchart illustrating a method or methods that support plasma-doped trenches for memory in accordance with examples as disclosed herein.

FIG. 4 shows a flowchart illustrating a method or methods 400 that support plasma-doped trenches for memory in accordance with examples as disclosed herein. The operations of method 400 may be implemented by a manufacturing system or one or more controllers associated with a manufacturing system. In some examples, one or more controllers may execute a set of instructions to control one or more functional elements of the manufacturing system to perform the described functions. Additionally, or alternatively, one or more controllers may perform aspects of the described functions using special-purpose hardware.

At 405, the method may include forming, above a substrate, a stack of materials including layers of a polysilicon material and an oxide material. The operations of 405 may be performed in accordance with examples as disclosed herein.

At 410, the method may include forming a trench in the stack of materials based at least in part on forming the stack of materials, where the trench includes at least a first sidewall, a second sidewall, and a bottom surface. The operations of 410 may be performed in accordance with examples as disclosed herein.

At 415, the method may include doping at least the first sidewall, the second sidewall, and the bottom surface of the trench, where the first sidewall, the second sidewall, and the bottom surface of the trench each include one or more of Boron, Carbon, Fluorine, Helium, or Hydrogen based at least in part on doping at least the first sidewall, the second sidewall, and the bottom surface of the trench. The operations of 415 may be performed in accordance with examples as disclosed herein.

In some examples, an apparatus (e.g., a manufacturing system) as described herein may perform a method or methods, such as the method 400. The apparatus may include features, circuitry, logic, means, or instructions (e.g., a non-transitory computer-readable medium storing instructions executable by one or more controllers to control one or more functional elements of the manufacturing system), or any combination thereof for performing the following aspects of the present disclosure:

Aspect 1: A method or apparatus including operations, features, circuitry, logic, means, or instructions, or any combination thereof for forming, above a substrate, a stack of materials including layers of a polysilicon material and an oxide material; forming a trench in the stack of materials based at least in part on forming the stack of materials, where the trench includes at least a first sidewall, a second sidewall, and a bottom surface; and doping at least the first sidewall, the second sidewall, and the bottom surface of the trench, where the first sidewall, the second sidewall, and the bottom surface of the trench each include one or more of Boron, Carbon, Fluorine, Helium, or Hydrogen based at least in part on doping at least the first sidewall, the second sidewall, and the bottom surface of the trench.

Aspect 2: The method or apparatus of aspect 1, where a concentration of the Boron, Carbon, Fluorine, Helium, or Hydrogen decreases in a first direction away from the first sidewall; a concentration of the Boron, Carbon, Fluorine, Helium, or Hydrogen decreases in a second direction away from the second sidewall; and a concentration of the Boron, Carbon, Fluorine, Helium, or Hydrogen decreases in a third direction away from the bottom surface.

Aspect 3: The method or apparatus of aspects 1 through 2, where forming the trench includes operations, features, circuitry, logic, means, or instructions, or any combination thereof for etching a portion of the first oxide material, the first polysilicon material, the second oxide material, and the second polysilicon material.

Aspect 4: The method or apparatus of aspect 3, where a portion of the first sidewall and the second sidewall of the trench that include the first polysilicon material include one or more of Boron, Carbon, Fluorine, Helium, or Hydrogen based at least in part on doping at least the first sidewall and the second sidewall and a portion of the bottom surface of the trench that includes the second polysilicon material includes one or more of Boron, Carbon, Fluorine, Helium, or Hydrogen based at least in part on doping at least the bottom surface of the trench.

Aspect 5: The method or apparatus of aspects 3 through 4, where a portion of the first sidewall and the second sidewall of the trench that include the first oxide material and the second oxide material do not include one or more of Boron, Carbon, Fluorine, Helium, or Hydrogen based at least in part on doping at least the first sidewall and the second sidewall.

Aspect 6: The method or apparatus of aspects 3 through 5, where the first polysilicon material, the second polysilicon material, and the third polysilicon material each have a different thickness and one or more of the first oxide material, the second oxide material, and the third oxide material have a same thickness.

Aspect 7: The method or apparatus of aspects 1 through 6, where at least the first sidewall, the second sidewall, and the bottom surface of the trench are doped using a plasma doping process.

Aspect 8: The method or apparatus of aspect 7, where the plasma doping process includes applying Boron fluoride, diborane, or methane to at least the first sidewall, the second sidewall, and the bottom surface of the trench.

Aspect 9: The method or apparatus of aspects 1 through 8, further including operations, features, circuitry, logic, means, or instructions, or any combination thereof for depositing, above an upper surface of the stack of materials, a photoresist material based at least in part on forming the stack of materials; depositing a dielectric material in the trench based at least in part on depositing the photoresist material; and removing the photoresist material based at least in part on depositing the dielectric material in the trench.

Aspect 10: The method or apparatus of aspect 9, further including operations, features, circuitry, logic, means, or instructions, or any combination thereof for depositing a liner in the trench before depositing the dielectric material in the trench, where the liner is in contact with the doped first sidewall, the doped second sidewall, and the doped bottom surface of the trench, where the dielectric material is in contact with the liner.

Aspect 11: The method or apparatus of aspects 9 through 10, further including operations, features, circuitry, logic, means, or instructions, or any combination thereof for planarizing the stack of materials based at least in part on depositing the dielectric material in the trench, where an upper surface of the stack of materials is coplanar with an upper surface of the dielectric material in the trench based at least in part on planarizing the stack of materials.

It should be noted that the described methods include possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 12: An apparatus, including: a substrate; a stack of materials positioned above the substrate, the stack of materials including layers of a polysilicon material and an oxide material; and a plug in the stack of materials, where the plug is adjacent to at least a first portion of the stack of materials, a second portion of the stack of materials, and a third portion of the stack of materials, and where the first portion of the stack of materials, the second portion of the stack of materials, and the third portion of the stack of materials each include one or more of Boron, Carbon, Fluorine, Helium, or Hydrogen.

Aspect 13: The apparatus of aspect 12, where: a concentration of the Boron, Carbon, Fluorine, Helium, or Hydrogen decreases in a first direction away from a first sidewall of the first portion of the stack of materials; a concentration of the Boron, Carbon, Fluorine, Helium, or Hydrogen decreases in a second direction away from a second sidewall of the second portion of the stack of materials; and a concentration of the Boron, Carbon, Fluorine, Helium, or Hydrogen decreases in a third direction away from a bottom surface of the third portion of the stack of materials.

Aspect 14: The apparatus of aspect 13, where the concentration of the Boron, Carbon, Fluorine, Helium, or Hydrogen is based at least in part on a type of dopant applied to the stack of materials, a duration a dopant is applied to the stack of materials for, or both.

Aspect 15: The apparatus of any of aspects 12 through 14, where the stack of materials includes a first oxide material, a first polysilicon material, a second oxide material, a second polysilicon material, a third oxide material, and a third polysilicon material, where: the first portion of the stack of materials includes at least the first polysilicon material; the second portion of the stack of materials includes at least the first polysilicon material; and the third portion of the stack of materials includes at least the second polysilicon material.

Aspect 16: The apparatus of aspect 15, where one or more of the first oxide material, the second oxide material, and the third oxide material have a same thickness, and the polysilicon material, the polysilicon material, and the polysilicon material each include a different thickness.

Aspect 17: The apparatus of any of aspects 12 through 16, further including: a liner in contact with the first portion of the stack of materials, the second portion of the stack of materials, and the third portion of the stack of materials.

Aspect 18: The apparatus of any of aspects 12 through 17, where the plug includes a dielectric material having a tapered shape.

Aspect 19: The apparatus of any of aspects 12 through 18, where an upper surface of the plug is coplanar with an upper surface of a first oxide material.

An apparatus is described. The following provides an overview of aspects of the apparatus as described herein:

Aspect 20: An apparatus, including: a substrate; a stack of materials positioned above the substrate, the stack of materials including alternating layers of a polysilicon material and an oxide material; and a plug in the stack of materials, where the plug includes a first sidewall in contact with a first portion of the stack of materials, a second sidewall in contact with a second portion of the stack of materials, and a bottom surface in contact with a third portion of the stack of materials, and where each of the first portion of the stack of materials, the second portion of the stack of materials, and the third portion of the stack of materials include a respective concentration of Boron, Carbon, Fluorine, Helium, or Hydrogen, or a combination thereof.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials, or combinations thereof. In some examples, one layer or level may be composed of two or more sublayers or sublevels.

The terms "if," "when," "based on," or "based at least in part on" may be used interchangeably. In some examples, if the terms "if" "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally, or alternatively (e.g., in an alternative example), be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, Boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   forming, above a substrate, a stack of materials comprising layers of a polysilicon material and an oxide material;
   forming a trench in the stack of materials based at least in part on forming the stack of materials, wherein the trench comprises at least a first sidewall, a second sidewall, and a bottom surface; and
   doping at least the first sidewall, the second sidewall, and the bottom surface of the trench, wherein the first sidewall, the second sidewall, and the bottom surface of the trench each comprise one or more of Boron, Carbon, Fluorine, Helium, or Hydrogen based at least in part on doping at least the first sidewall, the second sidewall, and the bottom surface of the trench.

2. The method of claim 1, wherein:
   a concentration of the Boron, Carbon, Fluorine, Helium, or Hydrogen decreases in a first direction away from the first sidewall;
   a concentration of the Boron, Carbon, Fluorine, Helium, or Hydrogen decreases in a second direction away from the second sidewall; and
   a concentration of the Boron, Carbon, Fluorine, Helium, or Hydrogen decreases in a third direction away from the bottom surface.

3. The method of claim 1, wherein the stack of materials comprises a first oxide material, a first polysilicon material, a second oxide material, a second polysilicon material, a third oxide material, and a third polysilicon material, wherein forming the trench comprises:

etching a portion of the first oxide material, the first polysilicon material, the second oxide material, and the second polysilicon material.

4. The method of claim 3, wherein:

a portion of the first sidewall and the second sidewall of the trench that comprise the first polysilicon material comprise one or more of Boron, Carbon, Fluorine, Helium, or Hydrogen based at least in part on doping at least the first sidewall and the second sidewall; and a portion of the bottom surface of the trench that comprises the second polysilicon material comprises one or more of Boron, Carbon, Fluorine, Helium, or Hydrogen based at least in part on doping at least the bottom surface of the trench.

5. The method of claim 3, wherein a portion of the first sidewall and the second sidewall of the trench that comprise the first oxide material and the second oxide material do not comprise one or more of Boron, Carbon, Fluorine, Helium, or Hydrogen based at least in part on doping at least the first sidewall and the second sidewall.

6. The method of claim 3, wherein:

the first polysilicon material, the second polysilicon material, and the third polysilicon material each have a different thickness; and one or more of the first oxide material, the second oxide material, and the third oxide material have a same thickness.

7. The method of claim 1, wherein at least the first sidewall, the second sidewall, and the bottom surface of the trench are doped using a plasma doping process.

8. The method of claim 7, wherein the plasma doping process comprises applying Boron fluoride, diborane, or methane to at least the first sidewall, the second sidewall, and the bottom surface of the trench.

9. The method of claim 1, further comprising:

depositing, above an upper surface of the stack of materials, a photoresist material based at least in part on forming the stack of materials;

depositing a dielectric material in the trench based at least in part on depositing the photoresist material; and removing the photoresist material based at least in part on depositing the dielectric material in the trench.

10. The method of claim 9, further comprising:

depositing a liner in the trench before depositing the dielectric material in the trench, wherein the liner is in contact with the first sidewall, the second sidewall, and the bottom surface of the trench, wherein the dielectric material is in contact with the liner.

11. The method of claim 9, further comprising:

planarizing the stack of materials based at least in part on depositing the dielectric material in the trench, wherein the upper surface of the stack of materials is coplanar with an upper surface of the dielectric material in the trench based at least in part on planarizing the stack of materials.

* * * * *